(12) United States Patent
Dai

(10) Patent No.: US 8,518,729 B1
(45) Date of Patent: Aug. 27, 2013

(54) METHOD FOR MANUFACTURING LIQUID CRYSTAL DISPLAY PANEL

(75) Inventor: Chao Dai, Guandong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 13/698,073

(22) PCT Filed: Sep. 14, 2012

(86) PCT No.: PCT/CN2012/081370
§ 371 (c)(1),
(2), (4) Date: Nov. 15, 2012

(30) Foreign Application Priority Data

Sep. 7, 2012 (CN) .......................... 2012 1 0330288

(51) Int. Cl.
*H01L 21/00* (2006.01)
(52) U.S. Cl.
USPC ..................... 438/30; 438/70; 257/E21.062
(58) Field of Classification Search
USPC ............ 438/607, 609; 257/E21.062, E21.37, 257/E21.372, E21.536
See application file for complete search history.

(56) References Cited

U.S. PATENT DOCUMENTS

2012/0068202 A1* 3/2012 Saito et al. ...................... 257/88

* cited by examiner

*Primary Examiner* — Cheung Lee
(74) *Attorney, Agent, or Firm* — Andrew C. Cheng

(57) ABSTRACT

A method includes forming a black photoresist layer on a substrate to form a black matrix; forming an isolation layer on the black matrix; forming first and second metal layers sequentially on the isolation layer to form source terminal/drain terminal and storage capacitor Com electrode; forming an ohmic contact layer on the second metal layer; forming a channel layer on the ohmic contact layer to form an island; forming a gate insulation layer on the channel layer and forming a third metal layer on the gate insulation layer to form a gate terminal and a storage capacitor counter electrode; forming a protection layer on the third metal layer; forming pixels on the protection layer; forming vias in the pixels; forming a transparent conductive layer on the pixels to form pixel electrode, thereby forming a COA substrate; and bonding the COA substrate to an upper substrate and filling liquid crystal therebetween.

11 Claims, 8 Drawing Sheets

300

300'

300''          310

METHOD FOR MANUFACTURING LIQUID CRYSTAL DISPLAY PANEL

BACKGROUND OF THE INVENTION

1. Field of the Invention

The present invention relates to the field of liquid crystal displaying, and in particular to a method for manufacturing liquid crystal display panel.

2. The Related Arts

Liquid crystal display (LCD) has a variety of advantages, such as thin device body, low power consumption, and being free of radiation, and is thus widely used. Most of the LCDs that are currently available in the market are backlighting LCDs, which comprise a liquid crystal display panel and a backlight module. The operation principle of the liquid crystal display panel is that liquid crystal molecules are interposed between two parallel glass substrates and electricity is applied to the glass substrates to control variation of orientation of the liquid crystal molecules in order to refract light emitting from the backlight module for generating images.

A liquid crystal display panel is generally composed of a color filter substrate, a thin film transistor (TFT) substrate, and liquid crystal (LC) and sealant interposed between the CF substrate and the TFT substrate. A general manufacturing process comprises a front stage of array process (including thin film, yellow light, etching, and film stripping), an intermediate stage of cell process (including bonding TFT substrate and the CF substrate), and a rear stage of assembling process (including mounting drive ICs and printed circuit board). The front stage of array process generally makes the TFT substrate for controlling the movement of liquid crystal molecules. The intermediate stage of cell process generally introduces the liquid crystal between the TFT substrate and the CF substrate. The rear stage of assembling process generally integrates the drive ICs and the printed circuit board to drive the liquid crystal molecules to rotate for displaying images.

An active matrix liquid crystal display (AMLCD), which is today's main stream, generally uses a bottom gate alternation TFT structure 300 (see FIG. 1) to serve as a switching element and this generally for the following considerations. First, the bottom gate may provide a light-shielding arrangement to avoid influence on stability of TFT component due to photo current from an active layer (which is generally a channel layer made of hydrogenated amorphous silicon (a-Si:H)) caused by irradiation of back light. Second, in operation, sequentially depositing SiNx (silicon nitride)/a-Si:H (hydrogenated amorphous silicon)/n+a-Si:H (nitrogen doped hydrogenated amorphous silicon) causes least influence on each interface. The commonly known top gate structure TFT 300' (see FIG. 2) is not used because of leakage current caused by irradiation of back light.

A commonly used COA (Color Filtering On Array) arrangement is to still arrange a black matrix as a layer of color filtering to block external interfering light and leakage of back light and the R, G, B pixels 310 are partially coated on a layer of the thin-film transistor 300" (see FIG. 3), wherein the TFT portion uses the bottom gate alternation structure. The manufacturing process is complicated, making the cost relatively high and the yield rate low.

SUMMARY OF THE INVENTION

An object of the present invention is to provide a method for manufacturing liquid crystal display panel, which simplifies the manufacture process so as to effectively lower down the manufacture cost.

To achieve the object, the present invention provides a method for manufacturing liquid crystal display panel, which comprises the following steps:

Step 1: providing a substrate;

Step 2: forming a black photoresist material layer on the substrate and applying a masking process to form a predetermined pattern so as to form a black matrix;

Step 3: forming an isolation layer on the black photoresist material layer;

Step 4: forming a first metal layer on the isolation layer, forming a second metal layer on the first metal layer, and applying a masking process to form a predetermined pattern so as to form source terminal/drain terminal and storage capacitor Com electrode;

Step 5: forming an ohmic contact layer on the second metal layer and applying a masking process to form a predetermined pattern so as to form a phosphorous-doped film on the metal electrode;

Step 6: forming a channel layer on the ohmic contact layer and applying a masking process to form a predetermined pattern so as to form an island;

Step 7: forming a gate insulation layer on the channel layer, forming a third metal layer on the gate insulation layer, and applying a masking process to form a predetermined pattern so as to form a gate terminal and a storage capacitor counter electrode, the storage capacitor counter electrode being arranged at an edge location of the black matrix;

Step 8: forming a protection layer on the third metal layer;

Step 9: forming R, G, B pixels on the protection layer;

Step 10: forming vias in locations of the R, G, B pixels corresponding to the source terminal and the storage capacitor;

Step 11: forming a transparent conductive layer on the R, G, B pixels and applying a masking process to form a predetermined pattern so as to form the pixel electrode, thereby forming a COA substrate; and Step 12: bonding the COA substrate to an upper substrate and filling liquid crystal between the COA substrate and the upper substrate so as to form a liquid crystal display panel.

The substrate comprises a glass substrate.

The first metal layer comprises an aluminum layer, which is formed on the isolation layer through sputtering.

The second metal layer comprises a molybdenum layer, which is formed on the first metal layer through sputtering.

The ohmic contact layer comprises a phosphorous-doped hydrogenated amorphous silicon layer, which is formed on the second metal layer through chemical vapor deposition.

The channel layer comprises a hydrogenated amorphous silicon layer, which is formed on the ohmic contact layer through chemical vapor deposition.

The gate insulation layer comprises a silicon nitride layer, which is formed on the channel layer through chemical vapor deposition.

The third metal layer comprises a molybdenum layer, an aluminum layer, a combination of molybdenum layer and aluminum layer, which is formed on the protection layer through sputtering.

The R, G, B pixels are formed on the protection layer through coating operation.

The transparent conductive layer comprises an indium tin oxides (ITO) layer, which is formed on the R, G, B pixels through sputtering.

The present invention also provides a method for manufacturing liquid crystal display panel, which comprises the following steps:

Step 1: providing a substrate;

Step 2: forming a black photoresist material layer on the substrate and applying a masking process to form a predetermined pattern so as to form a black matrix;

Step 3: forming an isolation layer on the black photoresist material layer;

Step 4: forming a first metal layer on the isolation layer, forming a second metal layer on the first metal layer, and applying a masking process to form a predetermined pattern so as to form source terminal/drain terminal and storage capacitor Com electrode;

Step 5: forming an ohmic contact layer on the second metal layer and applying a masking process to form a predetermined pattern so as to form a phosphorous-doped film on the metal electrode;

Step 6: forming a channel layer on the ohmic contact layer and applying a masking process to form a predetermined pattern so as to form an island;

Step 7: forming a gate insulation layer on the channel layer, forming a third metal layer on the gate insulation layer, and applying a masking process to form a predetermined pattern so as to form a gate terminal and a storage capacitor counter electrode, the storage capacitor counter electrode being arranged at an edge location of the black matrix;

Step 8: forming a protection layer on the third metal layer;

Step 9: forming R, G, B pixels on the protection layer;

Step 10: forming vias in locations of the R, G, B pixels corresponding to the source terminal and the storage capacitor;

Step 11: forming a transparent conductive layer on the R, G, B pixels and applying a masking process to form a predetermined pattern so as to form the pixel electrode, thereby forming a COA substrate; and Step 12: bonding the COA substrate to an upper substrate and filling liquid crystal between the COA substrate and the upper substrate so as to form a liquid crystal display panel; and wherein the substrate comprises a glass substrate;

wherein the first metal layer comprises an aluminum layer, which is formed on the isolation layer through sputtering;

wherein the second metal layer comprises a molybdenum layer, which is formed on the first metal layer through sputtering;

wherein the ohmic contact layer comprises a phosphorous-doped hydrogenated amorphous silicon layer, which is formed on the second metal layer through chemical vapor deposition;

wherein the channel layer comprises a hydrogenated amorphous silicon layer, which is formed on the ohmic contact layer through chemical vapor deposition;

wherein the gate insulation layer comprises a silicon nitride layer, which is formed on the channel layer through chemical vapor deposition;

wherein the third metal layer comprises a molybdenum layer, an aluminum layer, a combination of molybdenum layer and aluminum layer, which is formed on the protection layer through sputtering;

wherein the R, G, B pixels are formed on the protection layer through coating operation; and wherein the transparent conductive layer comprises an indium tin oxides (ITO) layer, which is formed on the R, G, B pixels through sputtering.

The efficacy of the present invention is that the present invention provides a method for manufacturing liquid crystal display panel, which greatly simplifies the manufacture of the color filter substrate of the conventional AMLCD. In this way, it only needs to deposit an ITO film on an upper glass substrate. Since there is no black matrix, the ITO film may be of better film formability and can be made flat and having better adherence to glass. Further, since a TFT of top gate structure is adopted, the channel layer can be made thinner and the deposition time is shortened with the electrical property improved and on-state current is increased and off-state current reduced. Compared to COA with bottom gate TFT, this arrangement can simplify the relatively complicated COA operation of one layer glass of TFT substrate, generally due to simplification of TFT operation. Further, since what is finally done is coating of R, G, B, comparatively, the TFT substrate side is flatter. This is favorable to control of liquid crystal in the liquid crystal cel.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Referring to FIGS. 4-17, the present invention provides a method for manufacturing liquid crystal display panel, which comprises the following steps:

Step 1: providing a substrate 20.

The substrate 20 is a transparent substrate. In the instant embodiment, the substrate 20 is a glass substrate.

Figure 1:
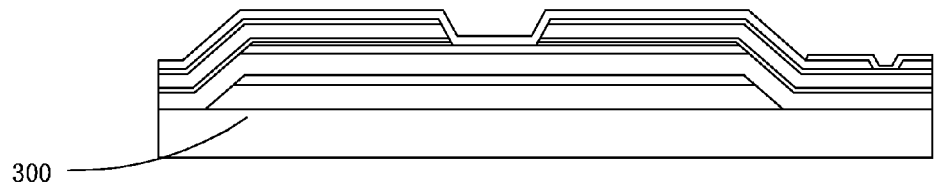
FIG. 1 is a schematic view showing the structure of a conventional bottom gate alternation TFT substrate.
Figure 2:
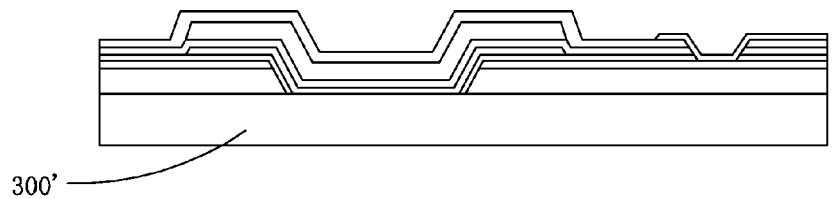
FIG. 2 is a schematic views showing the structure of a conventional bottom gate alternation TFT substrate.
Figure 3:
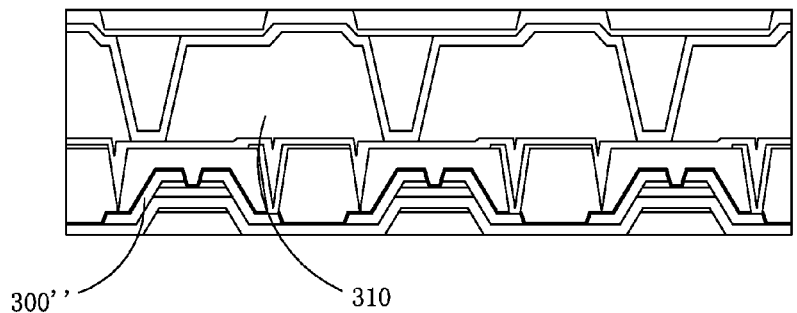
FIG. 3 is a schematic view showing the conventional structure of R, G, B formed on a TFT substrate liquid crystal panel.
Figure 4:
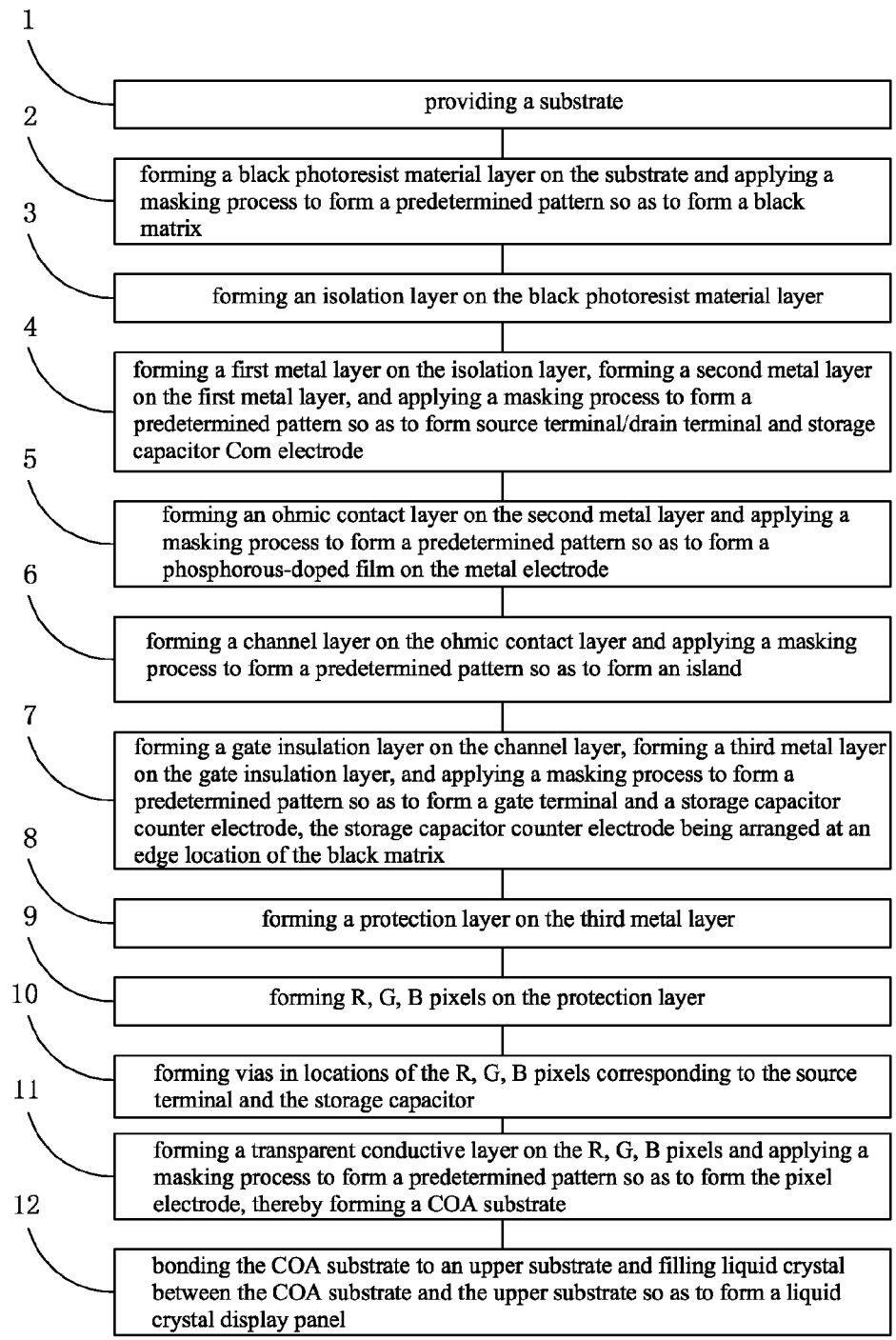
Figure 5:
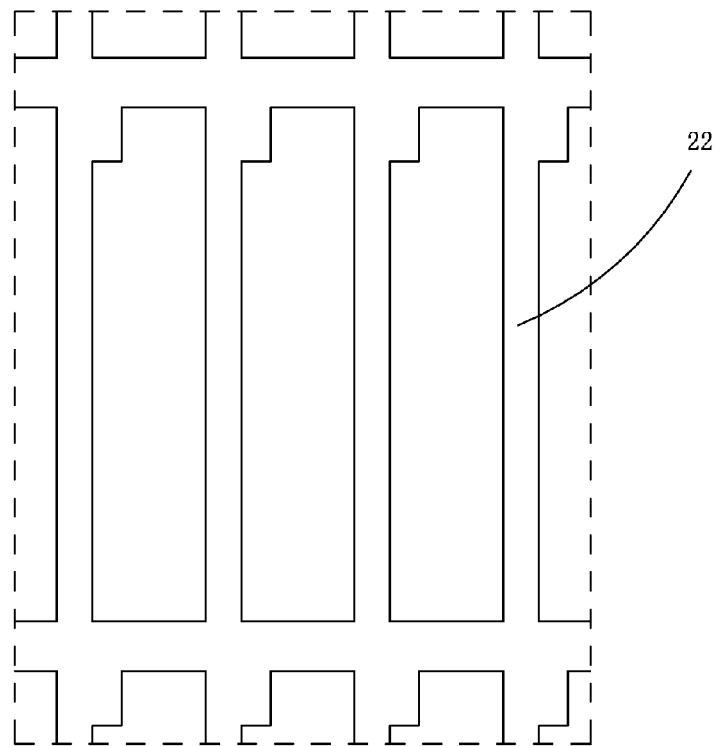
FIGS. 5-16 are schematic view showing structures of liquid crystal display panel at different stages of a method for manufacturing liquid crystal display panel according to the present invention.

Step 2: forming a black photoresist material layer on the substrate 20 and applying a masking process to form a predetermined pattern so as to form a black matrix 22 (as shown in FIG. 5).

The black photoresist material layer can be formed on the substrate 20 through stamping, printing, or coating. The masking process comprises operations of exposure, development, and etching.

Figure 6:
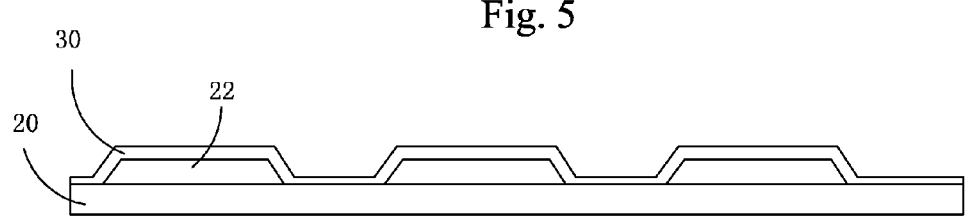

Step 3: forming an isolation layer 30 on the black photoresist material layer (as shown in FIG. 6).

The isolation layer 30 functions to prevent the photoresist material of the black matrix 22 from contaminating the material of top TFT component. In addition, the temperature and plasma used in vapor deposition and sputtering operations may damage the black matrix 22, and the deposition temperature of the isolation layer 30 is required to be relatively low. Further, the isolation layer 30 also helps handling the adherence issue of thin film material in the subsequent operations.

Figure 7:
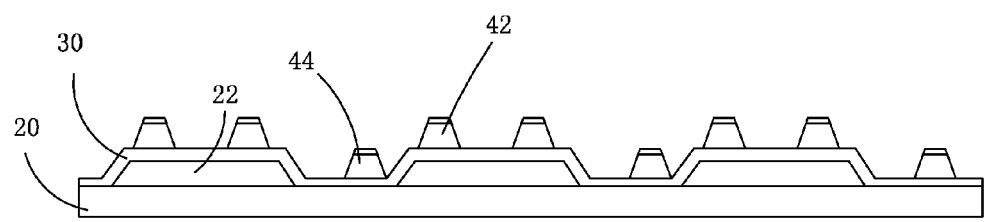
Figure 8:
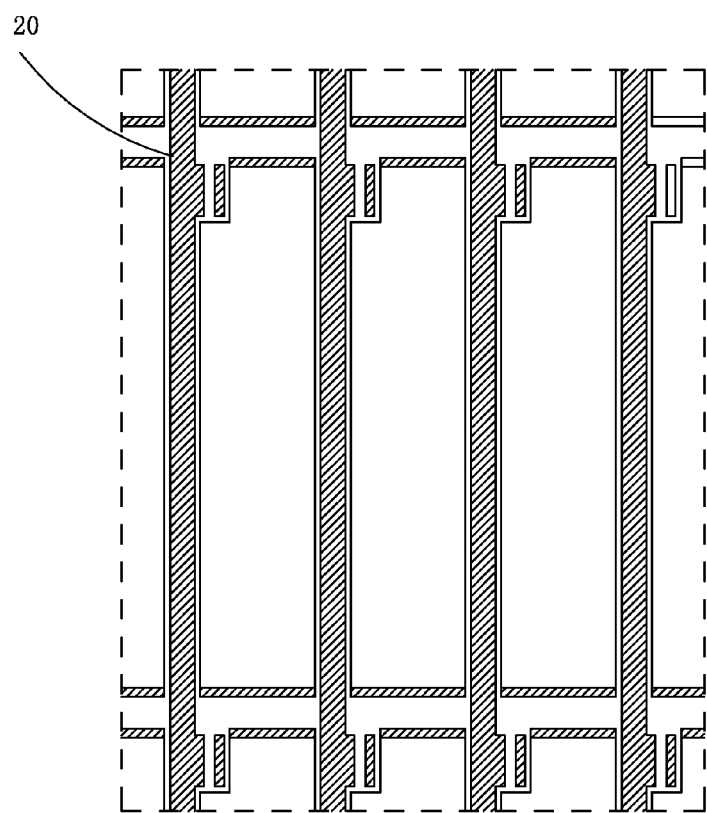

Step 4: forming a first metal layer on the isolation layer 30, forming a second metal layer on the first metal layer, and applying a masking process to form a predetermined pattern so as to form source terminal/drain terminal 42 and storage capacitor Com electrode 44 (as shown in FIGS. 7 and 8, wherein FIG. 8 is a top plan view of FIG. 7).

The first metal layer is formed on the isolation layer 30 through a sputtering operation. The second metal layer is formed on the first metal layer through a sputtering operation. In the instant embodiment, the first metal layer is an aluminum (Al) layer and the second metal layer is a molybdenum (Mo) layer. The first and second metal layers are subjected to operations of coating photoresist, exposure, development, etching, and peeling off photoresist to form the source terminal/drain terminal 42 and the storage capacitor Com electrode 44 on the isolation layer 30.

Figure 9:
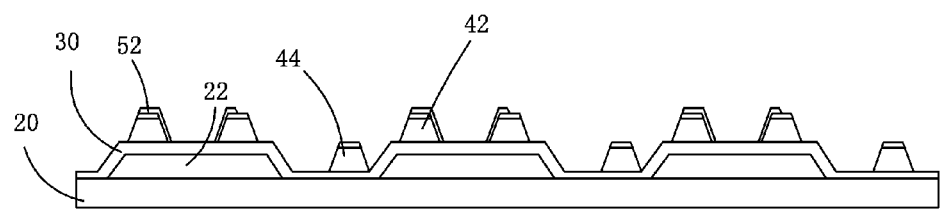

Step 5: forming an ohmic contact layer on the second metal layer and applying a masking process to form a predetermined pattern so as to form a phosphorous-doped film 52 on the metal electrode (as shown in FIG. 9).

The ohmic contact layer is a phosphorous-doped hydrogenated amorphous silicon (n+a-Si:H) layer, which is formed on the second metal layer through chemical vapor deposition (CVD) and is subjected to operations of coating photoresist, exposure, development, etching, and peeling off photoresist to form a phosphorous-doped (n+) film 52 on the second metal layer.

Figure 10:
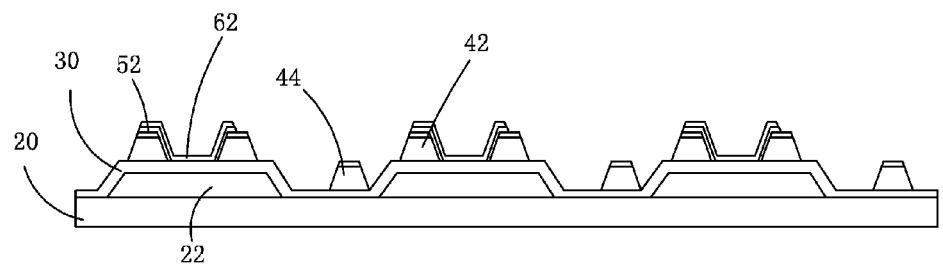

Step 6: forming a channel layer on the ohmic contact layer and applying a masking process to form a predetermined pattern so as to form an island 62 (as shown in FIG. 10).

The channel layer is a hydrogenated amorphous silicon (a-Si:H) layer, which is formed on the ohmic contact layer chemical vapor deposition (CVD) and is subjected to operations of coating photoresist, exposure, development, etching, and peeling off photoresist to form the island 62.

Figure 11:
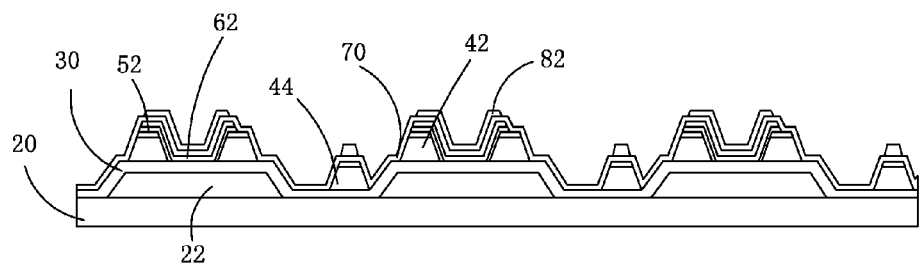

Step 7: forming a gate insulation layer 70 on the channel layer, forming a third metal layer on the gate insulation layer 70, and applying a masking process to form a predetermined pattern so as to form a gate terminal 82 and a storage capacitor counter electrode, the storage capacitor counter electrode being arranged at an edge location of the black matrix 22 (as shown in FIG. 11).

The gate insulation layer 70 is a silicon nitride (SiNx) layer, which is formed on the channel layer through chemical vapor deposition. The gate insulation layer 7 is a gate insulation layer (GI-SiNx).

The third metal layer is a molybdenum layer, aluminum layer, or a combination of molybdenum layer and aluminum layer, which is formed on the gate insulation layer 70 through sputtering. The specific structure of the third metal layer can be adjusted according to the contact of material. In the instant embodiment, the third metal layer is of a three layer structure of molybdenum layer, aluminum layer, and molybdenum layer.

The storage capacitor can be among the first, second, and third metal layers and may alternatively be formed among the first and second metal layers and the transparent conductive layer. Preferably, the storage capacitor is formed among the first and second metal layers and the third metal layer.

Figure 12:
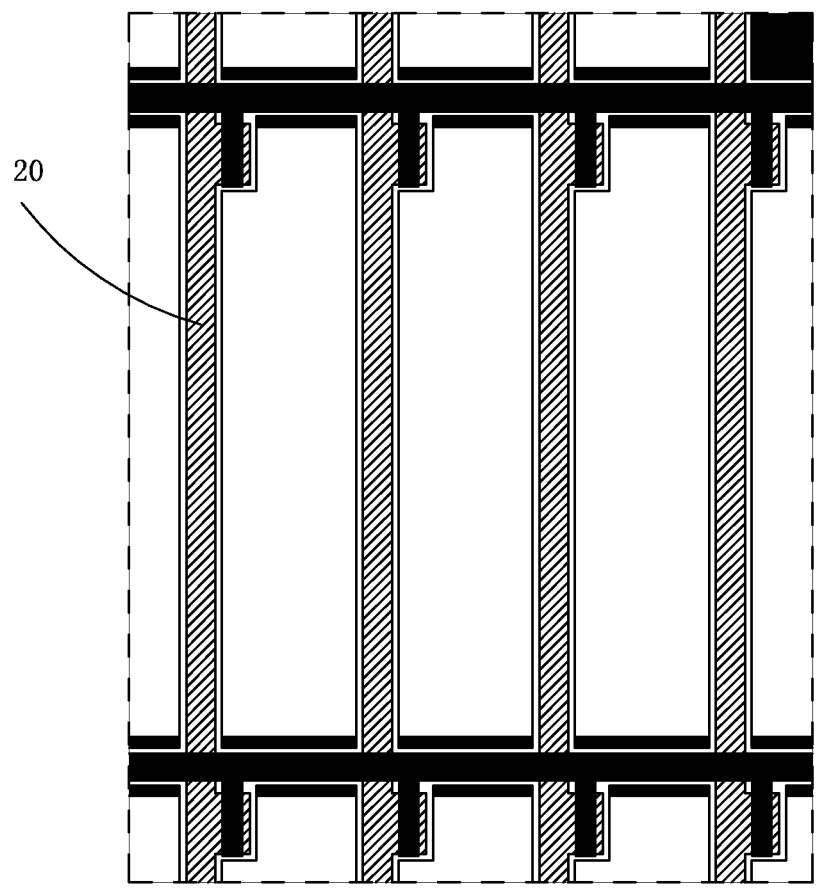

Referring to FIG. 12, which is a top plan view of FIG. 11, the storage capacitor is set at an edge location of the black matrix 22 in order to increase the aperture rate of the liquid crystal display panel.

Figure 13:
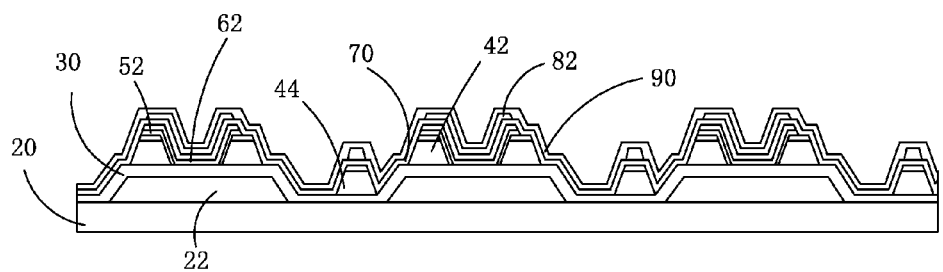

Step 8: forming a protection layer 90 on the third metal layer (as shown in FIG. 13).

The protection layer 90 is a SiNx layer.

Figure 14:
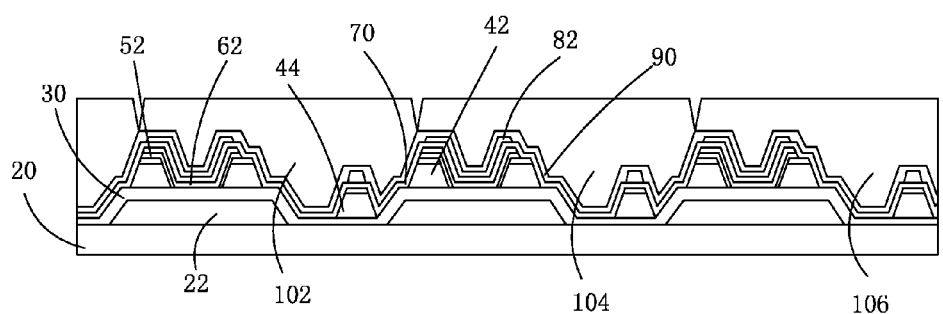

Step 9: forming R, G, B pixels 102, 104, 106 on the protection layer 90 (as shown in FIG. 14).

The R, G, B pixels 102, 104, 106 are formed on the protection layer 90 through coating operation.

Figure 15:
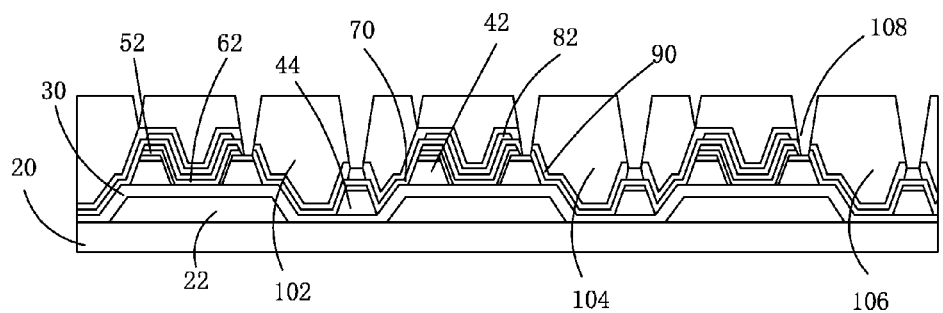

Step 10: forming vias in locations of the R, G, B pixels 102, 104, 106 corresponding to the source terminal 42 and the storage capacitor so as to form holes 108, the holes 108 being provided for the pixel electrode 112 to be electrically connected to the source terminal 42 and the storage capacitor (as shown in FIG. 15).

Figure 16:
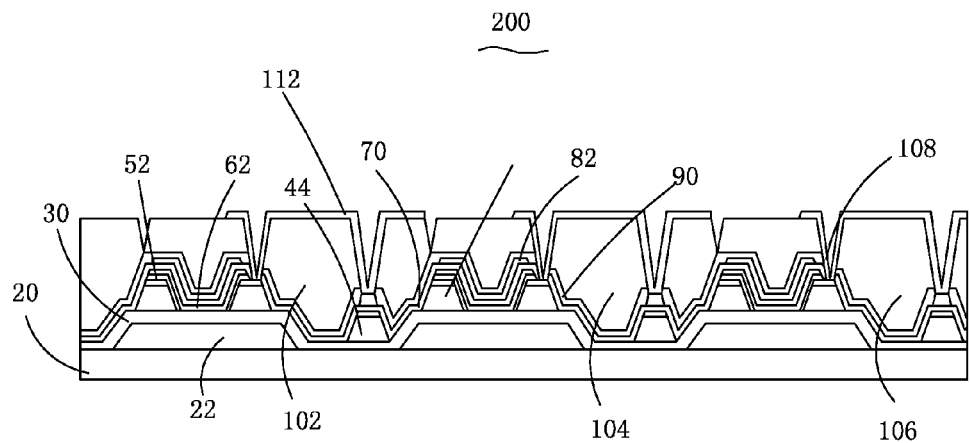

Step 11: forming a transparent conductive layer on the R, G, B pixels 102, 104, 106 and applying a masking process to form a predetermined pattern so as to form the pixel electrode 112, thereby forming a COA substrate 200 (as shown in FIG. 16).

The transparent conductive layer is an indium tin oxides (ITO) layer, which is formed through sputtering operation on the R, G, B pixels 102, 104, 106.

Figure 17:
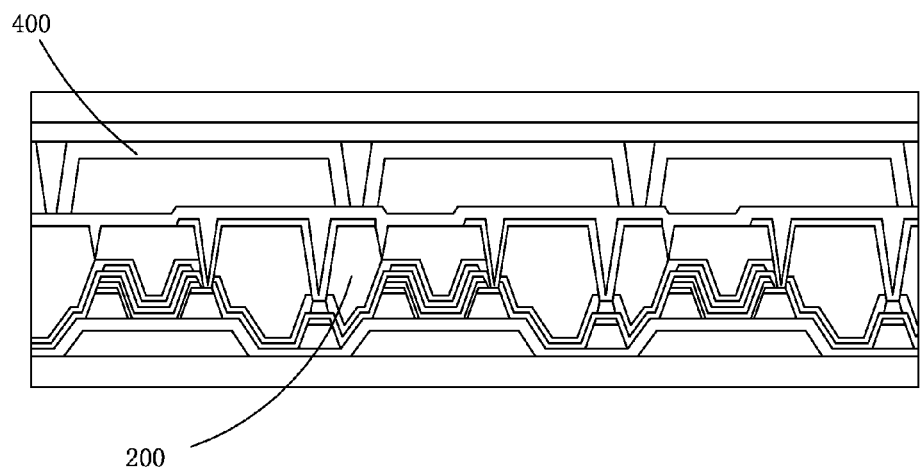
FIG. 17 is a schematic view showing a liquid crystal display panel manufactured with the method for manufacturing liquid crystal display panel according to the present invention.

Step 12: bonding the COA substrate 200 to an upper substrate 400 and filling liquid crystal (not shown) between the COA substrate 200 and the upper substrate 400 so as to form a liquid crystal display panel (as shown in FIG. 17).

It is noted that further simplification of the manufacture method can be made according to the present invention by the following processes:

The first process is to deposit the source terminal, the drain terminal, and the n+ layer simultaneously and then carry out etching.

The second process is to perform exposure and development of the source terminal and the drain terminal with the black matrix as a mask and to etch off lateral metal in etching the n+ layer.

In this way, the top layer of the gate terminal comprises an n+ layer. If this operation is taken, then the storage capacitor that is of a MIM arrangement is located above the black matrix.

Further, it is possible to deposit a layer of GI-SiNx that is thinner after the deposition of a-Si:H in Step 6 in order to form a better interface for preventing subsequent interface contamination issue. It is also possible to further deposit a thicker layer of GI-SiNx after the formation of the a-Si:H/GI-SiNx island. Since the interface has already been formed, fast deposition may be used to shorten the deposition time. It may also be possible to use an insulation contact layer of SiO2/Si.

In summary, the present invention provides a method for manufacturing liquid crystal display panel, which greatly simplifies the manufacture of the color filter substrate of the conventional AMLCD. In this way, it only needs to deposit an ITO film on an upper glass substrate. Since there is no black matrix, the ITO film may be of better film formability and can be made flat and having better adherence to glass. Further, since a TFT of top gate structure is adopted, the channel layer can be made thinner and the deposition time is shortened with the electrical property improved and on-state current is increased and off-state current reduced. Compared to COA with bottom gate TFT, this arrangement can simplify the relatively complicated COA operation of one layer glass of TFT substrate, generally due to simplification of TFT operation. Further, since what is finally done is coating of R, G, B, comparatively, the TFT substrate side is flatter. This is favorable to control of liquid crystal in the liquid crystal cell.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing liquid crystal display panel, comprising the following steps:
   (1) providing a substrate;
   (2) forming a black photoresist material layer on the substrate and applying a masking process to form a predetermined pattern so as to form a black matrix;
   (3) forming an isolation layer on the black photoresist material layer;
   (4) forming a first metal layer on the isolation layer, forming a second metal layer on the first metal layer, and applying a masking process to form a predetermined pattern so as to form source terminal/drain terminal and storage capacitor Com electrode;
   (5) forming an ohmic contact layer on the second metal layer and applying a masking process to form a predetermined pattern so as to form a phosphorous-doped film on the metal electrode;
   (6) forming a channel layer on the ohmic contact layer and applying a masking process to form a predetermined pattern so as to form an island;
   (7) forming a gate insulation layer on the channel layer, forming a third metal layer on the gate insulation layer, and applying a masking process to form a predetermined pattern so as to form a gate terminal and a storage capacitor counter electrode, the storage capacitor counter electrode being arranged at an edge location of the black matrix;
   (8) forming a protection layer on the third metal layer;
   (9) forming R, G, B pixels on the protection layer;
   (10) forming vias in locations of the R, G, B pixels corresponding to the source terminal and the storage capacitor;
   (11) forming a transparent conductive layer on the R, G, B pixels and applying a masking process to form a predetermined pattern so as to form the pixel electrode, thereby forming a COA substrate; and
   (12) bonding the COA substrate to an upper substrate and filling liquid crystal between the COA substrate and the upper substrate so as to form a liquid crystal display panel.

2. The method for manufacturing liquid crystal display panel as claimed in claim 1, wherein the substrate comprises a glass substrate.

3. The method for manufacturing liquid crystal display panel as claimed in claim 1, wherein the first metal layer comprises an aluminum layer, which is formed on the isolation layer through sputtering.

4. The method for manufacturing liquid crystal display panel as claimed in claim 1, wherein the second metal layer comprises a molybdenum layer, which is formed on the first metal layer through sputtering.

5. The method for manufacturing liquid crystal display panel as claimed in claim 1, wherein the ohmic contact layer comprises a phosphorous-doped hydrogenated amorphous silicon layer, which is formed on the second metal layer through chemical vapor deposition.

6. The method for manufacturing liquid crystal display panel as claimed in claim 1, wherein the channel layer comprises a hydrogenated amorphous silicon layer, which is formed on the ohmic contact layer through chemical vapor deposition.

7. The method for manufacturing liquid crystal display panel as claimed in claim 1, wherein the gate insulation layer comprises a silicon nitride layer, which is formed on the channel layer through chemical vapor deposition.

8. The method for manufacturing liquid crystal display panel as claimed in claim 1, wherein the third metal layer comprises a molybdenum layer, an aluminum layer, a combination of molybdenum layer and aluminum layer, which is formed on the protection layer through sputtering.

9. The method for manufacturing liquid crystal display panel as claimed in claim 1, wherein the R, G, B pixels are formed on the protection layer through coating operation.

10. The method for manufacturing liquid crystal display panel as claimed in claim 1, wherein the transparent conductive layer comprises an indium tin oxides (ITO) layer, which is formed on the R, G, B pixels through sputtering.

11. A method for manufacturing liquid crystal display panel, comprising the following steps:
   (1) providing a substrate;
   (2) forming a black photoresist material layer on the substrate and applying a masking process to form a predetermined pattern so as to form a black matrix;
   (3) forming an isolation layer on the black photoresist material layer;
   (4) forming a first metal layer on the isolation layer, forming a second metal layer on the first metal layer, and applying a masking process to form a predetermined pattern so as to form source terminal/drain terminal and storage capacitor Com electrode;
   (5) forming an ohmic contact layer on the second metal layer and applying a masking process to form a predetermined pattern so as to form a phosphorous-doped film on the metal electrode;
   (6) forming a channel layer on the ohmic contact layer and applying a masking process to form a predetermined pattern so as to form an island;
   (7) forming a gate insulation layer on the channel layer, forming a third metal layer on the gate insulation layer, and applying a masking process to form a predetermined pattern so as to form a gate terminal and a storage capacitor counter electrode, the storage capacitor counter electrode being arranged at an edge location of the black matrix;
   (8) forming a protection layer on the third metal layer;
   (9) forming R, G, B pixels on the protection layer;
   (10) forming vias in locations of the R, G, B pixels corresponding to the source terminal and the storage capacitor;
   (11) forming a transparent conductive layer on the R, G, B pixels and applying a masking process to form a predetermined pattern so as to form the pixel electrode, thereby forming a COA substrate; and
   (12) bonding the COA substrate to an upper substrate and filling liquid crystal between the COA substrate and the upper substrate so as to form a liquid crystal display panel; and
   wherein the substrate comprises a glass substrate;
   wherein the first metal layer comprises an aluminum layer, which is formed on the isolation layer through sputtering;
   wherein the second metal layer comprises a molybdenum layer, which is formed on the first metal layer through sputtering;

wherein the ohmic contact layer comprises a phosphorous-doped hydrogenated amorphous silicon layer, which is formed on the second metal layer through chemical vapor deposition;

wherein the channel layer comprises a hydrogenated amorphous silicon layer, which is formed on the ohmic contact layer through chemical vapor deposition;

wherein the gate insulation layer comprises a silicon nitride layer, which is formed on the channel layer through chemical vapor deposition;

wherein the third metal layer comprises a molybdenum layer, an aluminum layer, a combination of molybdenum layer and aluminum layer, which is formed on the protection layer through sputtering;

wherein the R, G, B pixels are formed on the protection layer through coating operation; and wherein the transparent conductive layer comprises an indium tin oxides (ITO) layer, which is formed on the R, G, B pixels through sputtering.

\* \* \* \* \*